(12) United States Patent
Noorbakhsh et al.

(10) Patent No.: US 10,954,595 B2
(45) Date of Patent: Mar. 23, 2021

(54) HIGH POWER SHOWERHEAD WITH RECURSIVE GAS FLOW DISTRIBUTION

(71) Applicant: APPLIED MATERIALS, INC., Santa Clara, CA (US)

(72) Inventors: Hamid Noorbakhsh, Fremont, CA (US); Xiaoping Zhou, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 61 days.

(21) Appl. No.: 16/526,748

(22) Filed: Jul. 30, 2019

(65) Prior Publication Data

US 2021/0032752 A1    Feb. 4, 2021

(51) Int. Cl.
  *C23C 16/40*  (2006.01)
  *C23C 16/455*  (2006.01)

(52) U.S. Cl.
  CPC .............................. *C23C 16/45565* (2013.01)

(58) Field of Classification Search
  CPC .............................................. C23C 16/45565
  USPC ........................ 118/715; 156/345.33, 345.34
  See application file for complete search history.

(56) References Cited

U.S. PATENT DOCUMENTS

| | | | |
|---|---|---|---|
| 6,983,892 B2 * | 1/2006 | Noorbakhsh | C23C 16/45565 239/553.3 |
| 7,661,386 B2 * | 2/2010 | Kasai | C23C 16/45565 118/666 |
| 8,128,751 B2 * | 3/2012 | Kasai | H01J 37/3244 118/715 |
| 8,512,510 B2 * | 8/2013 | Koshiishi | H01J 37/32935 156/345.34 |
| 8,536,071 B2 * | 9/2013 | Bettencourt | H01J 37/32605 438/798 |
| 8,573,152 B2 * | 11/2013 | de la Llera | H01R 13/20 118/723 E |
| 8,747,610 B2 * | 6/2014 | Chen | H01J 37/32504 156/345.39 |
| 8,876,024 B2 * | 11/2014 | Carducci | H01J 37/3244 239/558 |
| 9,540,731 B2 | 1/2017 | Noorbakhsh et al. | |
| 9,610,591 B2 * | 4/2017 | Lubomirsky | H01J 37/3244 |
| 9,911,579 B2 * | 3/2018 | Della Rosa | H01J 37/32807 |
| 10,373,810 B2 * | 8/2019 | Noorbakhsh | B05B 1/005 |
| 10,378,108 B2 * | 8/2019 | Wang | C23C 16/4401 |
| 10,607,816 B2 * | 3/2020 | Della Rosa | H01J 37/3244 |
| 10,625,277 B2 * | 4/2020 | Lubomirsky | H01J 37/32623 |

(Continued)

*Primary Examiner* — Rudy Zervigon

(74) *Attorney, Agent, or Firm* — Moser Taboada

(57) ABSTRACT

Embodiments of a showerhead for use in a substrate processing chamber are provided herein. In some embodiments, a showerhead for use in a substrate processing chamber includes an upper plate having an outer gas inlet fluidly coupled to an outer recursive gas path and an inner gas inlet fluidly coupled to an inner recursive gas path; and a lower plate having an upper surface bonded to the upper plate and a lower surface having a plurality of outer gas distribution holes and a plurality of inner gas distribution holes, wherein the upper surface includes an outer recess to define an outer annular gas plenum fluidly coupled to the outer gas inlet and to the plurality of outer gas distribution holes and an inner recess to define one or more inner annular gas plenums fluidly coupled to the inner gas inlet and to the plurality of inner gas distribution holes.

18 Claims, 5 Drawing Sheets

(56) References Cited

U.S. PATENT DOCUMENTS

| | | | |
|---|---|---|---|
| 10,697,061 B2* | 6/2020 | Shah | C23C 16/452 |
| 2009/0162261 A1 | 6/2009 | Baera et al. | |
| 2009/0179085 A1* | 7/2009 | Carducci | C23C 16/4557 |
| | | | 239/289 |
| 2011/0180233 A1* | 7/2011 | Bera | H01L 21/67109 |
| | | | 165/47 |
| 2014/0154888 A1* | 6/2014 | Stevenson | H01J 37/32532 |
| | | | 438/715 |
| 2016/0013026 A1* | 1/2016 | Matsuura | H01J 37/32568 |
| | | | 156/345.53 |
| 2016/0013028 A1* | 1/2016 | Matsuura | H01J 37/32532 |
| | | | 156/345.53 |
| 2017/0101713 A1* | 4/2017 | Wang | H01J 37/3244 |
| 2017/0335457 A1 | 11/2017 | Nguyen et al. | |
| 2018/0240650 A1* | 8/2018 | Matsuura | H01J 37/32568 |
| 2019/0271082 A1* | 9/2019 | Wang | C23C 16/45565 |

\* cited by examiner

HIGH POWER SHOWERHEAD WITH RECURSIVE GAS FLOW DISTRIBUTION

FIELD

Embodiments of the present disclosure generally relate to semiconductor processing equipment.

BACKGROUND

Conventional showerheads utilized in semiconductor process chambers (e.g., deposition chambers, etch chambers, or the like) typically include a showerhead body disposed between a gas distribution plate and a chill plate. However, for high power applications (e.g., power greater than 22 kW), the inventors have observed that a showerhead temperature becomes difficult to control and an area between the showerhead body and a center region of the gas distribution plate becomes prone to light up.

Accordingly, the inventors have provided embodiments of an improved showerhead.

SUMMARY

Embodiments of a showerhead for use in a substrate processing chamber are provided herein. In some embodiments, a showerhead for use in a substrate processing chamber includes an upper plate having an outer gas inlet fluidly coupled to an outer recursive gas path and an inner gas inlet fluidly coupled to an inner recursive gas path; and a lower plate having an upper surface bonded to the upper plate and a lower surface having a plurality of outer gas distribution holes and a plurality of inner gas distribution holes, wherein the upper surface includes an outer recess to define an outer annular gas plenum fluidly coupled to the outer gas inlet and to the plurality of outer gas distribution holes and an inner recess to define one or more inner annular gas plenums fluidly coupled to the inner gas inlet and to the plurality of inner gas distribution holes.

In some embodiments, a showerhead for use in a substrate processing chamber includes a gas distribution plate having an upper surface, a lower surface facing a processing volume; a showerhead body disposed on the gas distribution plate, the showerhead body comprising an upper plate having an outer gas inlet fluidly coupled to an outer recursive gas path and an inner gas inlet fluidly coupled to an inner recursive gas path; a lower plate having an upper surface bonded to the upper plate and a lower surface having a plurality of gas distribution holes, and a plurality of annular gas plenums disposed between the upper plate and the lower plate, wherein each hole of the plurality of gas distribution holes is fluidly coupled to one gas plenum of the plurality of annular gas plenums; a thermal gasket sheet disposed between the showerhead body and the gas distribution plate, wherein the thermal gasket sheet includes a plurality of openings corresponding with locations of the plurality of gas distribution holes of the showerhead body; and a clamp disposed about a peripheral edge of the gas distribution plate to clamp the gas distribution plate and the thermal gasket sheet to the showerhead body.

In some embodiments, a showerhead for use in a substrate processing chamber includes a gas distribution plate having an upper surface, a lower surface facing a processing volume, and a plurality of gas holes formed through the gas distribution plate from the upper surface to the lower surface; a showerhead body disposed on the gas distribution plate, the showerhead body comprising an upper plate having an outer gas inlet fluidly coupled to an outer recursive gas path and an inner gas inlet fluidly coupled to an inner recursive gas path; a lower plate having an upper surface bonded to the upper plate and a lower surface having a plurality of inner gas distribution holes and a plurality of outer gas distribution holes, an inner annular gas plenum disposed between the upper plate and lower plate and fluidly coupled to the inner gas inlet and the plurality of inner gas distribution holes, and an outer annular gas plenums disposed between the upper plate and the lower plate and fluidly coupled to the outer gas inlet and the plurality of outer gas distribution holes; a thermal gasket sheet disposed between the showerhead body and the gas distribution plate, wherein the thermal gasket sheet includes a plurality of openings; a clamp disposed about a peripheral edge of the gas distribution plate to clamp the gas distribution plate and the thermal gasket sheet to the showerhead body; a chill plate disposed above the showerhead body and having coolant channels configured to flow a coolant therethrough; and a thermal shim comprising a sheet disposed between the chill plate and the showerhead body.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
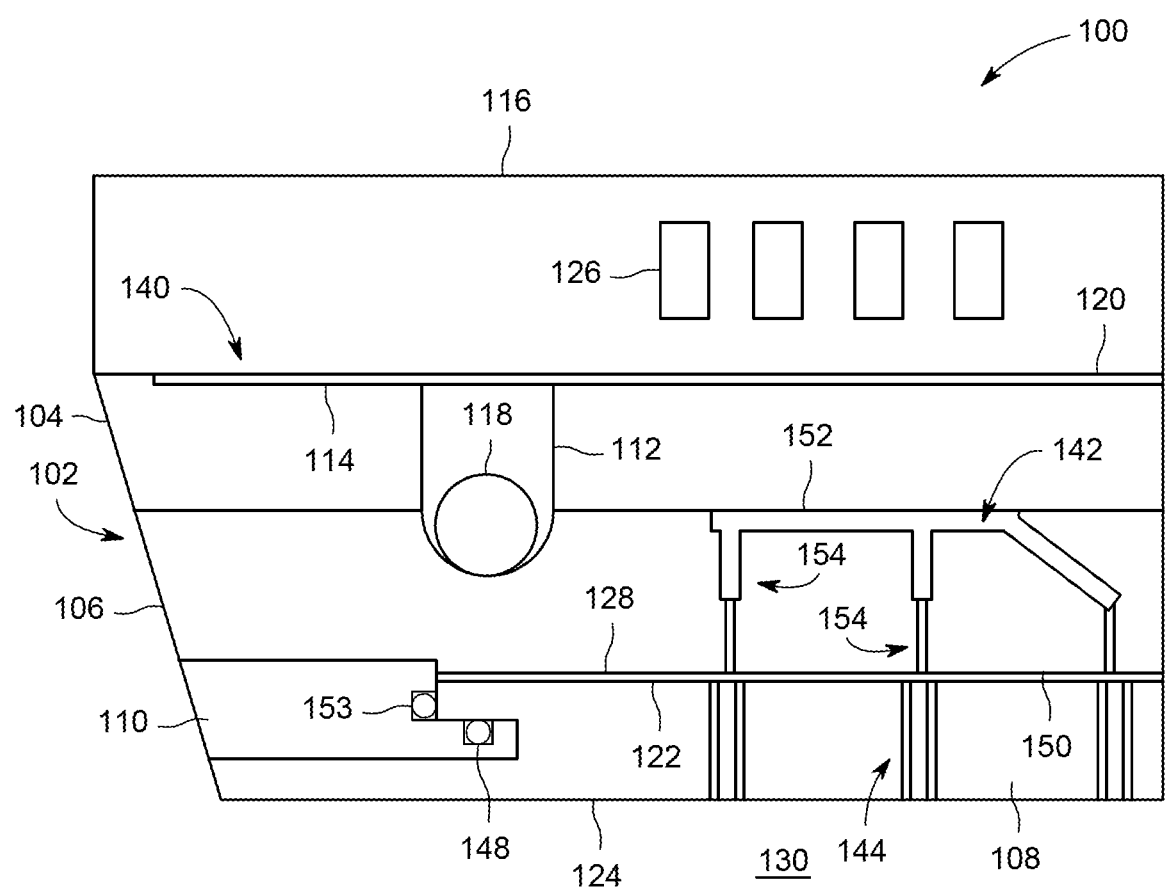
FIG. 1 depicts a schematic partial side view of a showerhead in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a showerhead are provided herein. The showerhead is disposed in a processing chamber, for example, an etch chamber, a deposition chamber, or the like. The showerhead is configured to facilitate a flow of process gas to a substrate being processed within the processing chamber. In some embodiments, the showerhead is configured to operate for high power applications (e.g., >22 kW). In some embodiments, the showerhead is configured to operate at a power of greater than 40 kW.

In some embodiments, the showerhead advantageously provides increased contact between a showerhead body and a chill plate to maximize heater transfer. In some embodiments, the showerhead includes recursive gas channels disposed therein to provide more uniform distribution of process gas from the showerhead body to the gas distribution plate to advantageously reduce or prevent etch rate skew. In some embodiments, a thermal gasket disposed between the showerhead body and a gas distribution plate has a reduced thickness to reduce or prevent light up between the showerhead body and the gas distribution plate.

FIG. 1 depicts a partial schematic side view of a showerhead in accordance with some embodiments of the present disclosure. The showerhead 100 has a generally annular shape. The showerhead 100 generally comprises a showerhead body 102, a gas distribution plate 108 and a clamp 110 configured to removably couple the gas distribution plate 108 to the showerhead body 102. The clamp 110 is disposed about a peripheral edge of the gas distribution plate 108. The gas distribution plate 108 includes an upper surface 122 and a lower surface 124 facing a processing volume 130. The gas distribution plate 108 includes a plurality of gas distribution holes 144 extending from the upper surface 122 to the lower surface 124. In some embodiments, the gas distribution plate 108 may be fabricated from single crystalline silicon (Si).

In some embodiments, the clamp 110 may include one or more channels formed in surfaces of the clamp 110 to accommodate one or more o-rings (o-ring 148 shown). When present, the o-ring 148 provides cushioning to the gas distribution plate 108 to prevent breakage of the gas distribution plate 108 when clamped to the showerhead body 102. The o-ring 148 may be fabricated from any suitable material, for example, rubber. In some embodiments, the o-ring 148 spaces the gas distribution plate 108 apart from the clamp 110. In some embodiments, an RF gasket 153 is disposed between the clamp 110 and the gas distribution plate 108, as depicted in FIG. 1. Positioning the RF gasket 153 along an inner diameter of the clamp 110 advantageously facilitates RF return and enhances the gas distribution plate 108 electrode area in the plasma. The RF gasket 153 may be fabricated from any suitable conductive material, for example stainless steel. The location of the o-rings and the RF gasket are illustrative only.

The showerhead body 102 includes an upper plate 104 bonded to a lower plate 106. In some embodiments, the upper plate 104 is diffusion bonded to the lower plate 106. The showerhead body 102 comprises a first side 140, a second side 150. In some embodiments, the first side 140 includes one or more annular grooves to accommodate one or more corresponding heating elements. For example, as shown in FIG. 1, the first side 140 includes a first annular groove 112 to accommodate a first heating element 118. In some embodiments, the showerhead body 102 includes a notched lower peripheral edge to accommodate the clamp 110.

In some embodiments, an upper surface of the lower plate 106 includes a first recess 142 to define a first annular gas plenum 152. In some embodiments, the lower plate 106 includes a plurality of gas distribution holes 154 extending from the first annular gas plenum 152 to the second side 150 of the showerhead body. The plurality of gas distribution holes facilitate the passage of process gases through the showerhead body 102 to the gas distribution plate 108. The showerhead body 102 may be fabricated from any suitable process compatible material, for example, such as aluminum. By fabricating the showerhead body 102 from a conductive material such as aluminum, the showerhead body 102 may function as an electrode to facilitate, for example, the formation of a plasma from process gases provided to the showerhead 100.

In some embodiments, a thermal gasket sheet 128 is disposed between the showerhead body 102 and the gas distribution plate 108. When present, the thermal gasket sheet 128 facilitates a heat exchange between the showerhead body 102 and the gas distribution plate 108. The thermal gasket sheet 128 includes a plurality of openings (See FIG. 5) corresponding with locations of the plurality of gas distribution holes 144 of the showerhead body 102. In some embodiments, the clamp 110 clamps the thermal gasket sheet 128 to the showerhead body 102

In some embodiments, the showerhead 100 includes a chill plate 116 disposed above the showerhead body 102. The chill plate 116 includes coolant channels 126 configured to flow a coolant therethrough to cool the showerhead body 102 and the gas distribution plate 108. In some embodiments, a thermal shim 120 is disposed between the chill plate 116 and the showerhead body 102. When present, the thermal shim 120 facilitates a heat exchange between the showerhead body 102 and the chill plate 116.

In some embodiments, the first side 140 of the showerhead body 102 includes a recess 114 to accommodate the thermal shim 120. In some embodiments, the recess 114 has a thickness of about 8.0 mils to about 20.0 mils. In some embodiments, the thermal shim 120 substantially covers an interface between the first side 140 of the showerhead body 102 and the chill plate 116 to provide greater thermal coupling. The thermal shim 120 is a thermally and electrically conductive sheet of material. In some embodiments, the thermal shim 120 comprises a polymer material. In some embodiments, the thermal shim 120 comprises an elastomer and metal sandwich structure, for example, a Q-pad®, available from The Bergquist Company, located in Chanhassen, Minn.

Figure 2:
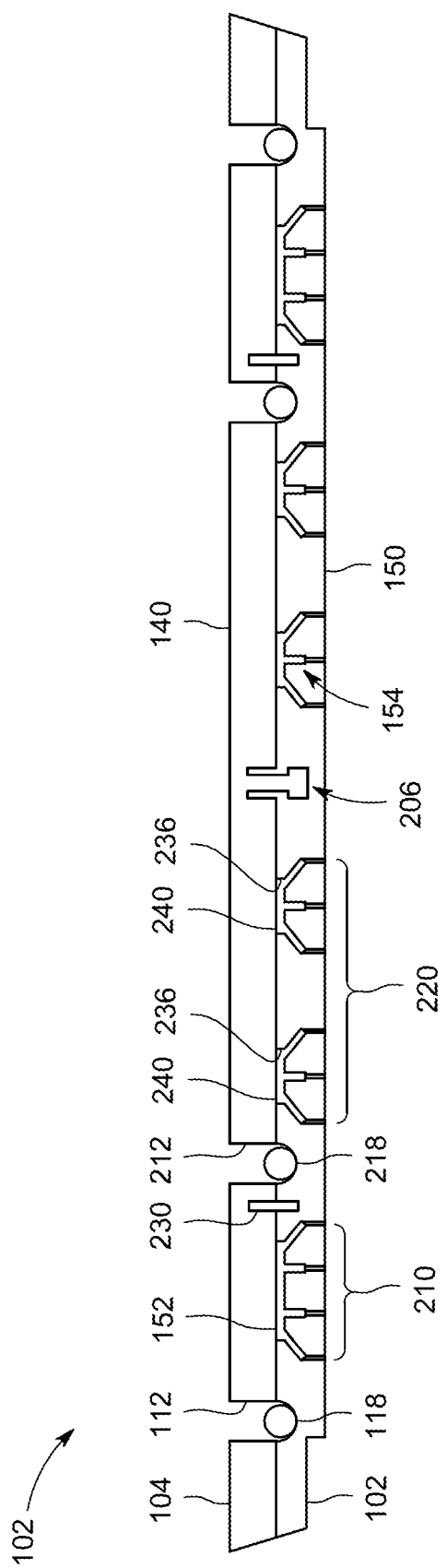
FIG. 2 depicts a schematic side view of a showerhead in accordance with some embodiments of the present disclosure.

FIG. 2 depicts a side view of a showerhead body in accordance with some embodiments of the present disclosure. In some embodiments, the showerhead body 102 includes a feature 206 proximate a center of the showerhead body 102 configured to accommodate a thermocouple to measure a temperature of the showerhead 100. In some embodiments, the showerhead body 102 includes one or more second recesses 236 to define corresponding ones of one or more second annular gas plenums 240 (two shown in FIG. 2). In some embodiments, the first annular gas plenum 152 corresponds with an outer annular gas plenum and the one or more second annular gas plenum 240 corresponds with one or more inner annular gas plenums. In some embodiments, the plurality of gas distribution holes 154 of the showerhead body 102 includes a plurality of outer gas distribution holes 210 and a plurality of inner gas distribution holes 220.

The first annular gas plenum 152 is fluidly coupled to the plurality of outer gas distribution holes 210 arranged in any suitable pattern. In some embodiments, the plurality of outer gas distribution holes 210 are arranged at regular intervals along four concentric rows. In some embodiments, the plurality of second gas distribution holes comprise 180 to 210 holes. The plurality of outer gas distribution holes 210 may extend from the first annular gas plenum 152 to the second side 150 perpendicular to a plane of the second side 150, at an angle with respect to a plane of the second side 150, or a combination thereof. In some embodiments, having four concentric rows of outer gas distribution holes 210, two concentric rows may extend perpendicular to the plane of the second side 150 and two concentric rows may extend at an angle to the plane of the second side 150.

The one or more second annular gas plenums 240 are fluidly coupled to the plurality of inner gas distribution holes 220 arranged in any suitable pattern. In some embodiments, the one or more second annular gas plenum 240 comprise two second annular gas plenums 240. The one or more second annular gas plenums 240 are fluidly coupled to a second gas inlet (Shown in FIG. 3) disposed on the first side 140 of the showerhead body 102. In some embodiments, the plurality of inner gas distribution holes are arranged at regular intervals along three concentric rows for each second annular gas plenum. In some embodiments, having three concentric rows of inner gas distribution holes 220, a center concentric row may extend perpendicular to the plane of the second side 150 and two concentric rows disposed on either side of the center concentric row may extend at an angle to the plane of the second side 150.

The plurality of inner gas distribution holes 220 may extend from the one or more second annular gas plenums 240 to the second side 150 perpendicular to a plane of the second side 150, at an angle with respect to a plane of the second side 150, or a combination thereof. In some embodiments, the plurality of second gas distribution holes comprise 110 to 140 holes.

In some embodiments, the first side 140 includes a second annular groove 212 to accommodate a second heating element 218. In some embodiments, the first heating element 118 and the second heating element 218 correspond to an outer heating element and an inner heating element, respectively. In some embodiments, the second heating element 218 is disposed between the first annular gas plenum 152 and the one or more second annular gas plenums 240. In some embodiments, the first heating element 118 is disposed radially outward of the first annular gas plenum 152.

The first heating element 118 and the second heating element 218 are configured to provide independent heating to two regions of the showerhead 100 (e.g., outer zone and inner zone) to control a temperature profile of the showerhead 100. While two heating elements are shown in FIG. 2, the showerhead 100 described herein may accommodate more than two heating elements to provide independent heating to more than two regions of the showerhead 100 for greater control of the temperature profile. In some embodiments, a thermal break 230 is disposed between adjacent heating elements to reduce thermal crosstalk between the regions.

Figure 3:
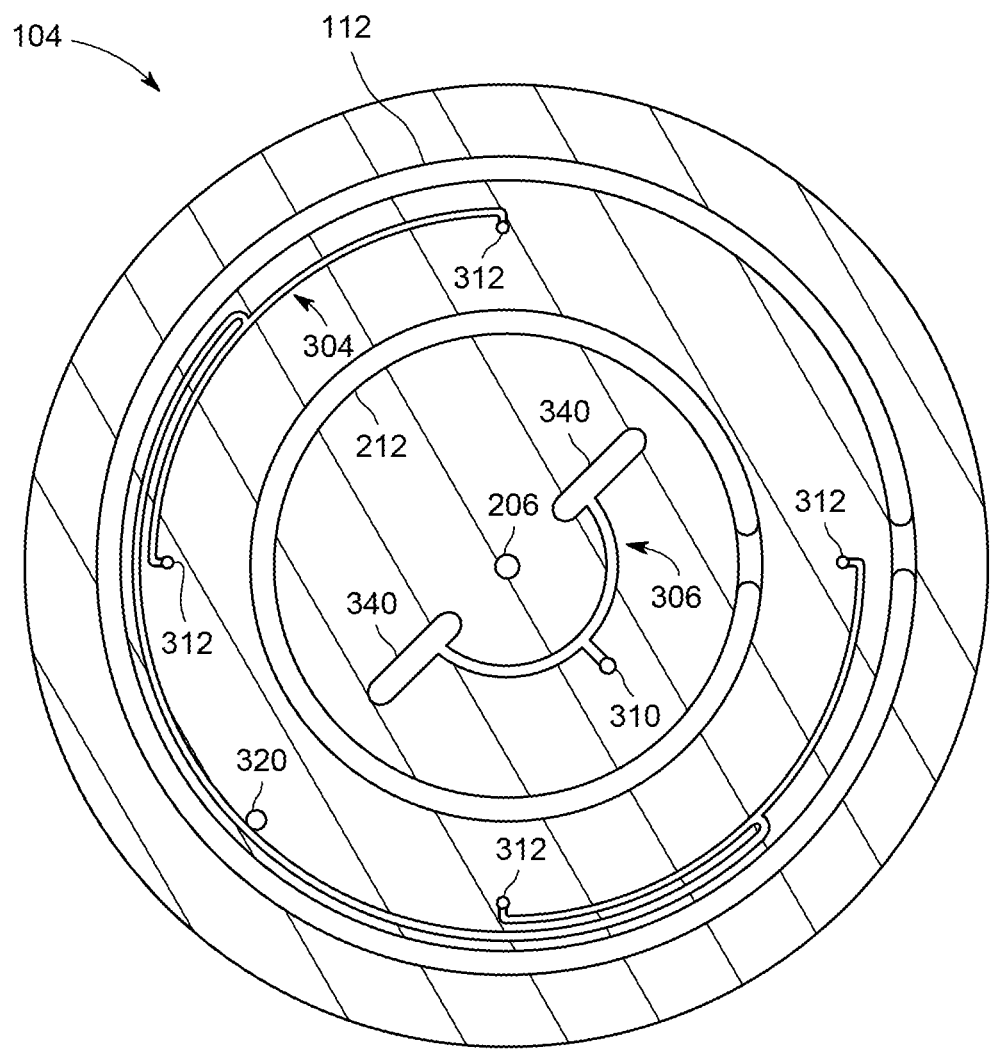
FIG. 3 depicts a cross-sectional top view of an upper plate of a showerhead in accordance with some embodiments of the present disclosure.

FIG. 3 depicts a cross-sectional top view of an upper plate of a showerhead in accordance with some embodiments of the present disclosure. In some embodiments, the upper plate 104 includes an outer gas inlet 320 fluidly coupled to an outer recursive gas path 304. The outer recursive gas path 304 is configured to flow gas substantially equally from the outer gas inlet 320 to a plurality of first outlets 312. In some embodiments, the outer recursive gas path 304 includes gas flow paths that are substantially equal in length from the outer gas inlet 320 to each of the plurality of first outlets 312. In some embodiments, the plurality of first outlets 312 comprises 4 outlets. In some embodiments, the plurality of first outlets 312 comprises 8, 16, or 32 outlets. In some embodiments, the outer recursive gas path 304 has dimensions of about 0.05 inches to about 0.15 inches by about 0.1 inches to about 0.3 inches.

In some embodiments, the upper plate 104 includes an inner gas inlet 310 fluidly coupled to an inner recursive gas path 306. The inner recursive gas path 306 is configured to flow gas substantially equally from the inner gas inlet 310 to a plurality of second outlets 340. In some embodiments, each of the plurality of second outlets 340 spans over the one or more second annular gas plenums 240 to fluidly couple each of the one or more second annular gas plenums 240 to the inner gas inlet 310. In some embodiments, the plurality of second outlets 340 are recesses on a lower surface of the upper plate 104. In some embodiments, the inner recursive gas path 306 includes gas flow paths that are substantially equal in length from the inner gas inlet 310 to each of the plurality of second outlets 340. In some embodiments, the plurality of second outlets 340 comprises 2 or 4 outlets. In some embodiments, the inner recursive gas path 306 has dimensions of about 0.05 inches to about 0.15 inches by about 0.1 inches to about 0.3 inches.

The outer recursive gas path 304 and the inner recursive gas path 306 advantageously provide more uniform distribution of process gas from the showerhead body 102 to the gas distribution plate 108 to advantageously reduce or prevent etch rate skew. In some embodiments, the outer gas inlet 320 extends into the upper plate 104 at an angle with respect to an upper surface of the upper plate 104 to reduce or prevent light up. In some embodiments, the inner gas inlet 310 extends into the upper plate 104 at an angle with respect to an upper surface of the upper plate 104 to reduce or prevent light up.

Figure 4:
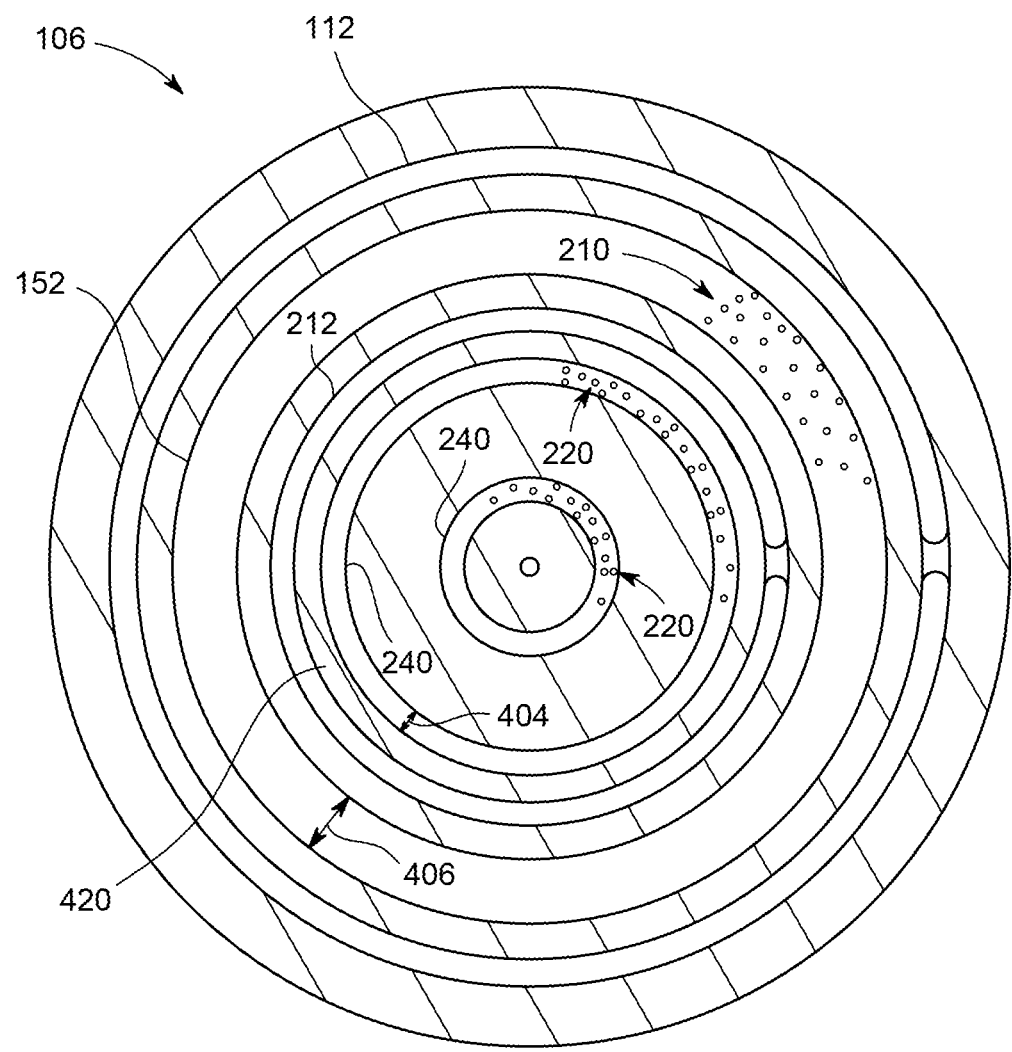
FIG. 4 depicts a cross-sectional top view of a lower plate of a showerhead in accordance with some embodiments of the present disclosure.

FIG. 4 depicts a cross-sectional top view of a lower plate of a showerhead in accordance with some embodiments of the present disclosure. In some embodiments, the first annular groove 112 and the second annular groove 212 extend from the first side 140 and into the lower plate 106. In some embodiments, a width 406 of the first annular gas plenum 152 is greater than a width 404 of each of the one or more second annular gas plenums 240. In some embodiments, the first annular gas plenum 152 and the one or more second annular gas plenums 240 have a width 406, 404 greater than a depth to advantageously reduce or prevent light up. The lower plate 106 includes a ridge 420 between each adjacent second annular gas plenum 240. The ridge 420 on the lower plate 106 advantageously provides enhanced thermal coupling between the chill plate 116 and the gas distribution plate 108.

With the outer recursive gas path 304 and the inner recursive gas path 306 disposed within the upper plate 104 and the first annular gas plenum 152 and the one or more second annular gas plenums 240 disposed in the lower plate 106, the thermal shim 120 can substantially cover the first side 140 of the showerhead body 102 (except for the outer gas inlet 320, inner gas inlet 310, and any mounting holes). The embedded gas paths and gas plenums advantageously provides for greater thermal coupling between the showerhead body 102 and the chill plate 116 to adequately cool the showerhead 100 in high power application.

Figure 5:
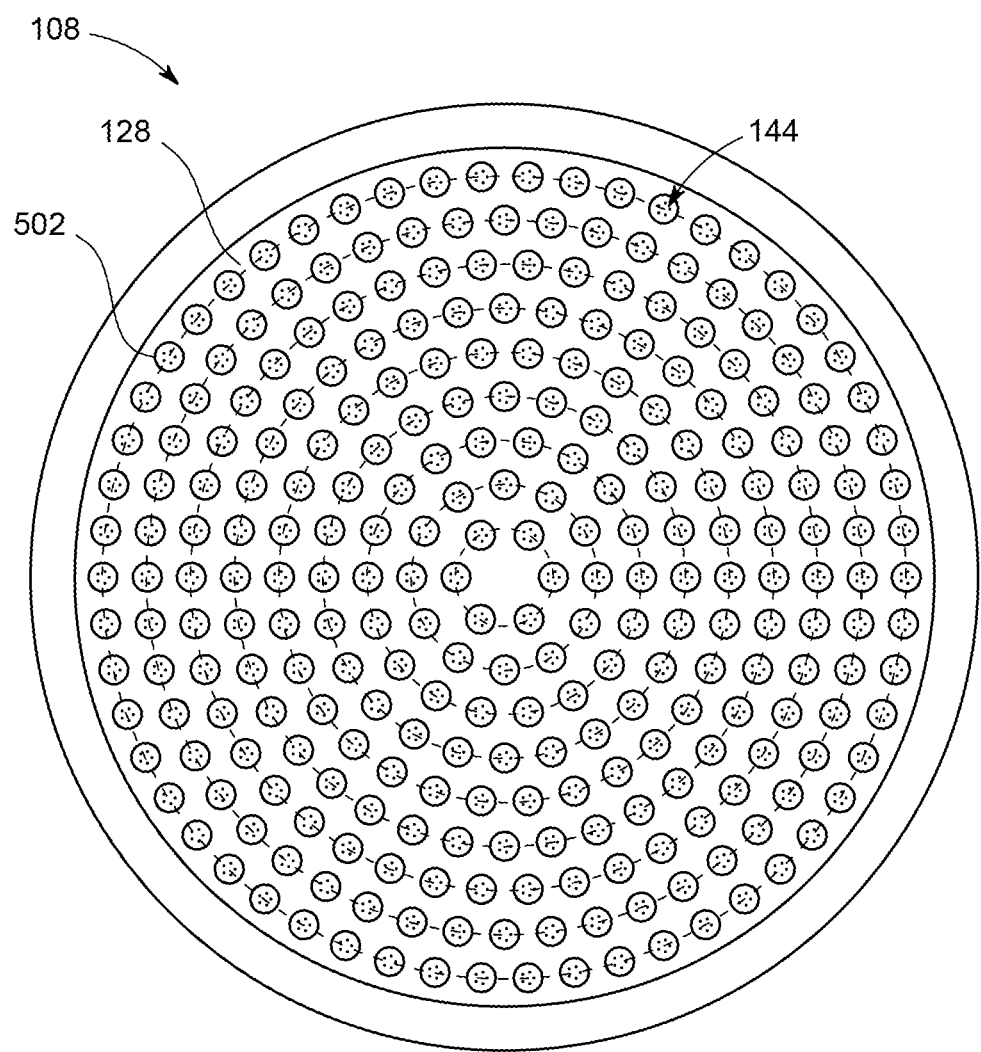
FIG. 5 depicts a top view a gas distribution plate in accordance with some embodiments of the present disclosure.

FIG. 5 depicts a top view a gas distribution plate in accordance with some embodiments of the present disclosure. In some embodiments, the plurality of gas distribution holes 144 of the gas distribution plate 108 are arranged in clusters. In some embodiments, the thermal gasket sheet 128 disposed between the gas distribution plate and the showerhead body 102 includes a plurality of openings 502 arranged so that the gas distribution holes 144 are exposed to the showerhead body 102. In some embodiments, the thermal gasket sheet 128 advantageously has a thickness of about 0.5 mm or less. In some embodiments, the thermal gasket sheet 128 may be formed of a similar material as the thermal shim 120. The inventors have discovered that by minimizing the thickness of the thermal gasket sheet 128, plasma light-up between the gas distribution plate 108 and the showerhead body 102 may be reduced or prevented at high power (e.g., combined source and bias power of 22 kW or greater).

While the foregoing is directed to embodiments of the present disclosure, other and further embodiments of the disclosure may be devised without departing from the basic scope thereof.

The invention claimed is:

1. A showerhead for use in a substrate processing chamber, comprising: an upper plate having an outer gas inlet fluidly coupled to an outer recursive gas path and an inner gas inlet fluidly coupled to an inner recursive gas path; and a lower plate having an upper surface bonded to the upper plate and a lower surface having a plurality of outer gas distribution holes and a plurality of inner gas distribution holes, wherein the upper surface includes an outer recess to define an outer annular gas plenum fluidly coupled to the outer gas inlet and to the plurality of outer gas distribution holes and an inner recess to define one or more inner annular gas plenums fluidly coupled to the inner gas inlet and to the plurality of inner gas distribution holes; an inner heating element disposed between the outer annular gas plenum and the one or more inner annular gas plenums and an outer heating element disposed radially outward of the outer annular gas plenum; a thermal break between the inner heating element and the outer heating element.

2. The showerhead of claim 1, wherein the outer recursive gas path is configured to flow gas substantially equally from the outer gas inlet to a plurality of first outlets and the inner recursive gas path is configured to flow gas substantially equally from the inner gas inlet to a plurality of second outlets.

3. The showerhead of claim 2, wherein the plurality of first outlets comprise 4 outlets.

4. The showerhead of claim 1, wherein the plurality of outer gas distribution holes are arranged at regular intervals along four concentric rows.

5. The showerhead of claim 1, wherein the one or more inner annular gas plenum comprises two or more inner annular gas plenums coupled to the inner gas inlet via a recess on a lower surface of the upper plate.

6. The showerhead of claim 5, wherein the plurality of inner gas distribution holes are arranged at regular intervals along three concentric rows for each inner annular gas plenum.

7. The showerhead of claim 6, wherein the plurality of inner gas distribution holes comprise 110 to 140 holes.

8. The showerhead of claim 1, wherein the outer annular gas plenum and the one or more inner annular gas plenums have a width greater than a depth.

9. A showerhead for use in a substrate processing chamber, comprising:
a gas distribution plate having an upper surface, a lower surface facing a processing volume;
a showerhead body disposed on the gas distribution plate, the showerhead body comprising an upper plate having an outer gas inlet fluidly coupled to an outer recursive gas path and an inner gas inlet fluidly coupled to an inner recursive gas path; a lower plate having an upper surface bonded to the upper plate and a lower surface having a plurality of gas distribution holes, and a plurality of annular gas plenums disposed between the upper plate and the lower plate, wherein each hole of the plurality of gas distribution holes is fluidly coupled to one gas plenum of the plurality of annular gas plenums;

a thermal gasket sheet disposed between the showerhead body and the gas distribution plate, wherein the thermal gasket sheet includes a plurality of openings corresponding with locations of the plurality of gas distribution holes of the showerhead body; and
a clamp disposed about a peripheral edge of the gas distribution plate to clamp the gas distribution plate and the thermal gasket sheet to the showerhead body.

10. The showerhead of claim 9, further comprising an inner heating element disposed between adjacent annular gas plenums of the plurality of annular gas plenums and an outer heating element disposed radially outward from the plurality of annular gas plenums.

11. The showerhead of claim 9, further comprising a chill plate disposed above the showerhead body and having coolant channels configured to flow a coolant therethrough.

12. The showerhead of claim 11, further comprising a thermal shim disposed between the chill plate and the showerhead body and substantially covering an upper surface of the upper plate.

13. The showerhead of claim 12, wherein the thermal shim comprises a polymer shim or a Q-pad.

14. The showerhead of claim 9, wherein the thermal gasket sheet has a thickness of about 0.5 mm or less.

15. A showerhead for use in a substrate processing chamber, comprising:
a gas distribution plate having an upper surface, a lower surface facing a processing volume, and a plurality of gas holes formed through the gas distribution plate from the upper surface to the lower surface;
a showerhead body disposed on the gas distribution plate, the showerhead body comprising an upper plate having an outer gas inlet fluidly coupled to an outer recursive gas path and an inner gas inlet fluidly coupled to an inner recursive gas path; a lower plate having an upper surface bonded to the upper plate and a lower surface having a plurality of inner gas distribution holes and a plurality of outer gas distribution holes, an inner annular gas plenum disposed between the upper plate and lower plate and fluidly coupled to the inner gas inlet and the plurality of inner gas distribution holes, and an outer annular gas plenums disposed between the upper plate and the lower plate and fluidly coupled to the outer gas inlet and the plurality of outer gas distribution holes;
a thermal gasket sheet disposed between the showerhead body and the gas distribution plate, wherein the thermal gasket sheet includes a plurality of openings;
a clamp disposed about a peripheral edge of the gas distribution plate to clamp the gas distribution plate and the thermal gasket sheet to the showerhead body;
a chill plate disposed above the showerhead body and having coolant channels configured to flow a coolant therethrough; and
a thermal shim comprising a sheet disposed between the chill plate and the showerhead body.

16. The showerhead of claim 15, wherein the thermal gasket sheet has a thickness of about 0.5 mm or less.

17. The showerhead of claim 15, wherein an upper surface of the upper plate includes a recess to accommodate the thermal shim.

18. The showerhead of claim 15, further comprising an inner heating element disposed between the inner annular gas plenum and outer annular gas plenum and an outer heating element disposed radially outward from the outer annular gas plenum, and further comprising a thermal break in the showerhead body between the inner heating element and the outer heating element.

\* \* \* \* \*